(12) United States Patent
Watanabe et al.

(10) Patent No.: US 8,099,860 B2
(45) Date of Patent: Jan. 24, 2012

(54) ELECTRONIC COMPONENT MOUNTING APPARATUS

(75) Inventors: Akio Watanabe, Gunma (JP); Takuya Imoto, Gunma (JP); Yoshiharu Fukushima, Gunma (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 947 days.

(21) Appl. No.: 12/036,735

(22) Filed: Feb. 25, 2008

(65) Prior Publication Data

US 2008/0201940 A1    Aug. 28, 2008

(30) Foreign Application Priority Data

Feb. 28, 2007   (JP) ................................. 2007-048343

(51) Int. Cl.
*B23P 19/00*    (2006.01)
(52) U.S. Cl. ............... 29/740; 29/709; 29/834; 700/259
(58) Field of Classification Search .................... 29/709, 29/720, 739, 740, 832–834; 226/76; 356/614; 377/16, 18, 30; 414/730, 752.1; 700/259
See application file for complete search history.

(56) References Cited

U.S. PATENT DOCUMENTS

| | | | | |
|---|---|---|---|---|
| 4,756,012 | A * | 7/1988 | French, III | 377/30 |
| 7,017,263 | B2 * | 3/2006 | Yanagida | 29/740 |
| 7,219,823 | B2 * | 5/2007 | Yanagida | 226/76 |

FOREIGN PATENT DOCUMENTS

JP    05-338618    12/1993

* cited by examiner

*Primary Examiner* — Donghai D. Nguyen
(74) *Attorney, Agent, or Firm* — Morrison & Foerster LLP

(57) ABSTRACT

The invention prevents reduction of a pickup rate even when a storage tape in use and a new storage tape are connected to each other with a connection tape. A component recognition camera takes an image of an electronic component held by a suction nozzle, and a recognition processing device performs recognition processing. When a positional shifting amount calculated by CPU based on the recognition processing result is more than α, a board recognition camera takes an image of a storage portion of a storage tape storing a next electronic component to be picked up. When a positional shifting amount of the storage portion calculated based on the recognition processing result is more than β, the CPU enables seam passage processing. Based on the image taking of the storage portion by the board recognition camera and the recognition processing by the recognition processing device which are performed each time the storage tape is fed N times, the CPU controls correction of a pickup position.

5 Claims, 7 Drawing Sheets

ELECTRONIC COMPONENT MOUNTING APPARATUS

CROSS-REFERENCE OF THE INVENTION

This application claims priority from Japanese Patent Application No. 2007-048343, the content of which is incorporated herein by reference in its entirety.

BACKGROUND OF THE INVENTION

1. Field of the Invention

The invention relates to an electronic component mounting apparatus having a plurality of component feeding units aligned on a feeder base, the component feeding unit feeding an electronic component stored in a storage tape to a component pickup position, in which a suction nozzle picks the electronic component fed by the component feeding unit and mounts the electronic component on a printed board.

2. Description of the Related Art

In this kind of electronic component mounting apparatus, particularly in a high-speed gantry-type mounting device, since the component feeding units are fixed and not moved, there are rapidly increasing users employing the so-called splicing where storage tapes are connected to each other for supplying the components during automatic driving. A method of connecting storage tapes to each other is described in the Japanese patent application publication No. hei 5-338618 and so on, for example, and a technology of facilitating the connection work is proposed.

However, when the number of remaining electronic components becomes small and a storage tape in use and a new storage tape are connected to each other with a connection tape in the component feeding unit, the connection tape may cause shifting of a position where the suction nozzle should descend and pick up the electronic component at the component feeding unit and cause a component pickup error to reduce a pickup rate. Other causes than this may also provide the same effect.

SUMMARY OF THE INVENTION

The invention is directed to preventing reduction of a pickup rate of an electronic component even in the described case.

The invention provides an electronic component mounting apparatus having a plurality of aligned component feeding units feeding an electronic component stored in a storage portion of a storage tape to a component pickup position, in which a suction nozzle picks up the electronic component fed to the component pickup position by the component feeding unit and mounts the electronic component on a printed board, the apparatus including: a component recognition camera taking an image of the electronic component picked up from the component feeding unit and held by suction by the suction nozzle; a storage portion recognition camera taking an image of the storage portion; and a control device controlling the storage portion recognition camera to take an image of the storage portion storing a next electronic component to be picked up when a positional shifting amount of the electronic component of which the image is taken by the component recognition camera is more than a first predetermined value.

The invention also provides a method of mounting an electronic component in which a plurality of component feeding units feeding an electronic component stored in a storage portion of a storage tape to a component pickup position is aligned, and a suction nozzle picks up the electronic component fed to the component pickup position and mounts the electronic component on a printed board, the method including: picking up the electronic component from the component feeding unit and holding the electronic component by suction by the suction nozzle; taking an image of the electronic component held by suction by the suction nozzle by a component recognition camera; taking an image of the storage portion reaching the component pickup position by a storage portion recognition camera; and taking an image of the storage portion storing a next electronic component to be picked up by the storage portion recognition camera when a positional shifting amount of the electronic component of which the image is taken by the component recognition camera is more than a first predetermined value.

DETAILED DESCRIPTION OF THE INVENTION

An electronic component mounting apparatus having an electronic component feeding device and an electronic component mounting apparatus body will be described with reference to the drawings. This electronic component mounting apparatus is a so-called multifunctional chip mounter, which can mount a variety of electronic components on a printed board P.

Figure 1:
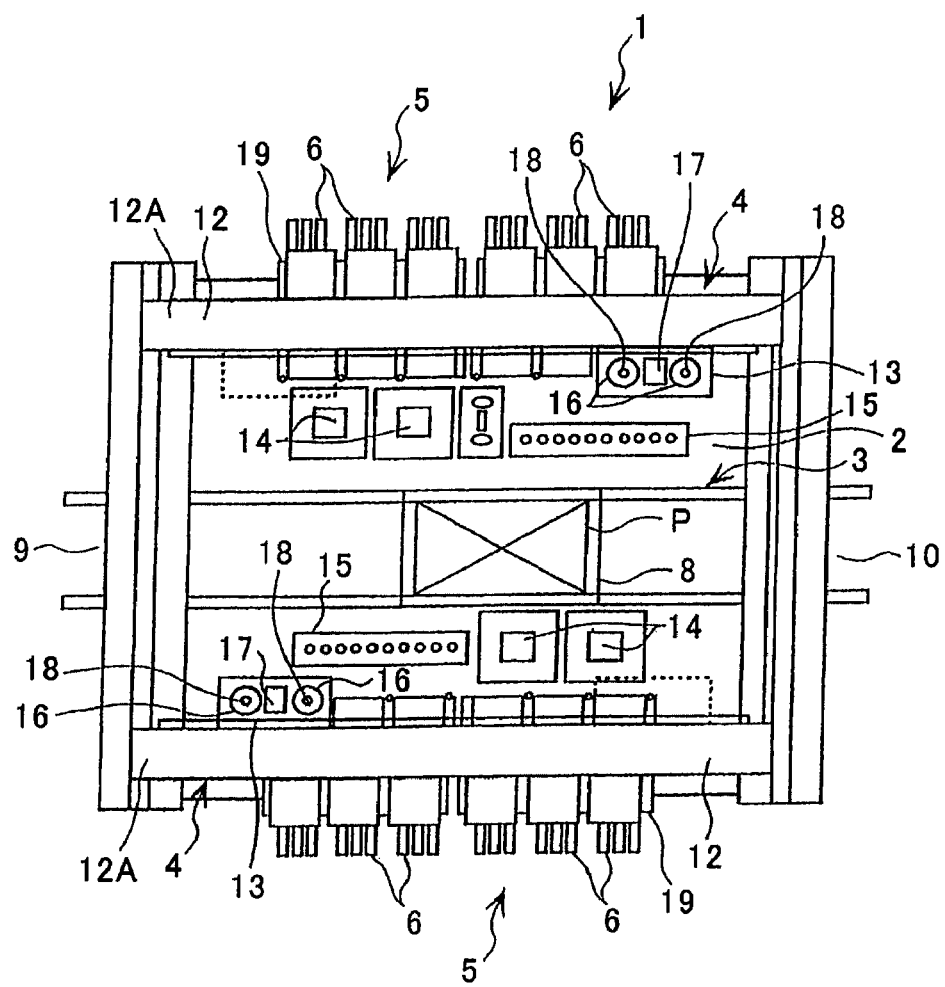
FIG. 1 is a plan view of an electronic component mounting apparatus.

FIG. 1 is a plan view of the electronic component mounting apparatus. An electronic component mounting apparatus body 1 includes a base 2, a conveyer portion 3 extending in a lateral direction in a center of the base 2, and two component mounting portions 4 and two component feeding portions 5 each provided on the front (on a lower side of FIG. 1) and the rear (on an upper side of FIG. 1) of the base 2. Each of the component feeding portions 5 is detachably set with a plurality of component feeding units 6 as the electronic component feeding device, thereby forming the electronic component mounting apparatus.

The conveyer portion 3 includes a central set table 8, a left feeding conveyer 9, and a right discharging conveyer 10. The printed board P is supplied from the feeding conveyer 9 to the set table 8, and is fixed at a predetermined height so as to be mounted with electronic components. After completing the electronic component mounting, the printed board P is discharged from the set table 8 to a downstream device through the discharging conveyer 10.

Each of the component mounting portions 4 is provided with an XY stage 12 movably mounted with a head unit 13, a component recognition camera 14, and a nozzle stocker 15. The head unit 13 is mounted with two mounting heads 16 for picking up and mounting the electronic components, and a board recognition camera 17 for recognizing the position of the printed board P. Normally, the XY stages 12 of both the component mounting portions 4 are alternately driven.

In each of the XY stages 12, a beam 12A moves in a Y direction driven by a Y axis drive motor 12Y, and the head unit 13 moves in an X direction driven by an X axis drive motor 12X. Therefore, the head unit 13 moves in the X and Y directions.

In each of the component feeding portions 5, many component feeding units 6 are laterally and detachably aligned on a feeder base 19. Each of the component feeding units 6 is provided with a storage tape C storing many electronic components in storage portions Cc aligned at predetermined pitches, which will be described below. By intermittently feeding the storage tape C, the electronic components are fed one by one from an end of the component feeding unit 6 to the component mounting portion 4.

This electronic component mounting apparatus body 1 is driven based on mounting data stored in a storage portion thereof. First, the XY stage 12 is driven, the head unit 13 moves to the component feeding unit 6, and then a suction nozzle 18 of the mounting head 16 is lowered to pick a required electronic component. Then, the mounting head 16 rises up, and the XY stage 12 is driven to move the electronic component to a position right above the component recognition camera 14. The component recognition camera 14 recognizes the posture and position of the electronic component on the suction nozzle 18. Next, the mounting head 16 moves to above the printed board P on the set table 8, and the board recognition camera 17 recognizes the position of the printed board P. Then, an X axis drive motor 12X and a Y axis drive motor 12Y of the XY stage 12, and a θ axis drive motor 18A of the suction nozzle 18 are moved by a corrected amount based on a recognition result of the component recognition camera 14 and the board recognition camera 17, and then the electronic component is mounted on the printed board P.

Figure 2:
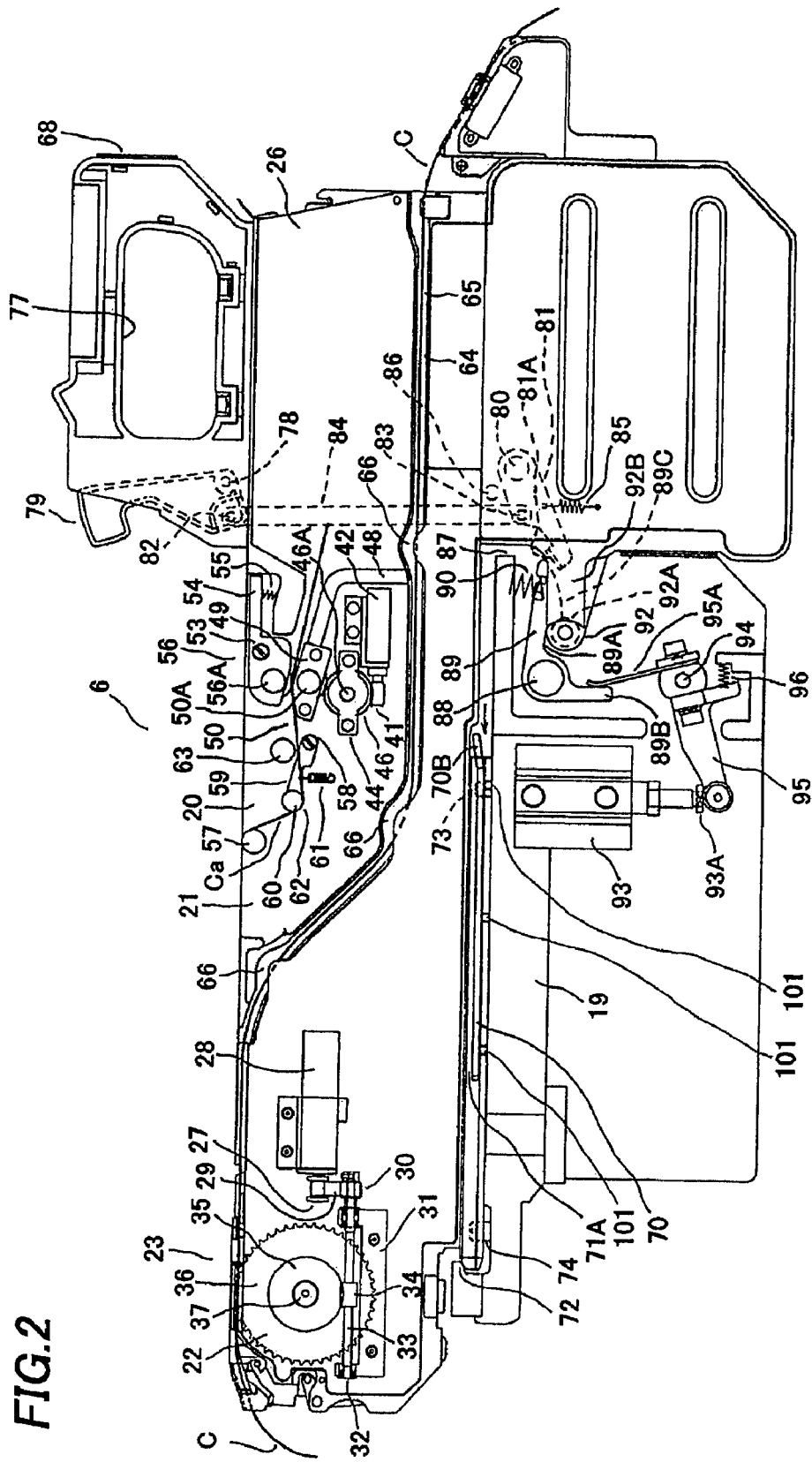
FIG. 2 is a side view of a component feeding unit fixed on a feeder base.
Figure 3:
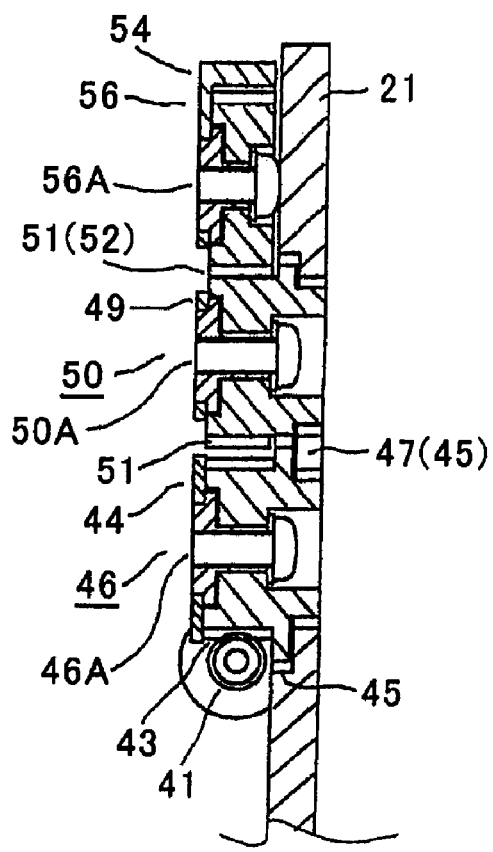
FIG. 3 is a vertical cross-sectional view of a cover tape peeling system of FIG. 2.

Next, the component feeding unit 6 will be described based on FIGS. 2 and 3. The component feeding unit 6 includes a unit frame 21, a storage tape reel (not shown) rotatably mounted on the unit frame 21, a tape feeding system 22 for intermittently feeding the storage tape C let out from the storage tape reel reeled with the storage tape C to a position where the electronic component is picked up by the suction nozzle 18, and a cover tape peeling system 20 for peeling a cover tape Ca from the storage tape C just before the pickup position.

The storage tape C let out from the storage tape reel is fed to the pickup position under a suppressor 23 which is provided just before the pickup position in a tape route. This suppressor 23 is formed with an opening for picking. The suppressor 23 is also formed with a slit. The cover tape Ca of the storage tape C is peeled off at this slit, and stored in a storage portion 26. That is, the electronic component stored in the storage tape C is fed to a position of the opening for picking, with the cover tape Ca being peeled off, and picked up by the suction nozzle 18.

Next, the tape feeding system 22 will be explained referring to FIG. 2. The tape feeding system 22 includes a servomotor 28 which is provided with a gear 27 at its output axis and serves as a drive source which can rotate forward and backward, a rotation axis 33 rotatably supported by a supporting body 31 through a bearing 32 and provided with a gear 30 at its end where a timing belt 29 is stretched from the gear 27, and a sprocket 36 provided with a worm wheel 35 engaged with a worm gear 34 provided in a center of the rotation axis 33 and also engaged with feed holes Cb formed in the storage tape C to feed the storage tape C. The support axis 37 of the worm wheel 35 and the sprocket 36 penetrates an intermediate partition body of a unit frame 21.

Therefore, when the servomotor 28 is driven to rotate forward in order to feed an electronic component stored in the storage tape C in the component feeding unit 6, the gear 27 and the gear 30 rotate through the timing belt 29 to rotate the rotation axis 33 only, and the sprocket 36 intermittently rotates by a predetermined angle in a forward direction through the worm gear 34 and the worm wheel 35 to intermittently feed the storage tape C with the feed holes Cb.

Next, the cover tape peeling system 20 will be described. The cover tape peeling system 20 includes a drive motor 42, a first rotating body 46, a second rotating body 50, a third rotating body 56, a roller 57, and a tension applying body 62. The drive motor 42 is provided with a worm gear 41 at its output axis. The first rotating body 46 is provided with a gear 43 engaged with a gear 45 and the gear 41 therearound, and is rotatably supported by a supporting body 44 through a support axis 46A, the supporting body 44 being fixed on the unit frame 21. The second rotating body 50 is provided with a gear 47 engaged with a contact portion 51 and the gear 45 therearound, and is rotatably supported by a supporting body 49 through a support axis 50A, the supporting body 49 being fixed on the unit frame 21 through an attachment body 48. The third rotating body 56 is provided with a contact portion 52 contacting with the contact portion 51 being pushed by a spring 55 therearound, and is rotatably supported by an attachment body 54 through a support axis 56A, the attachment body 54 being fixed on the unit frame 21 and rotatable through a support axis 53. The roller 57 is provided for guiding the cover tape Ca. The tension applying body 62 is provided with the roller 60 for guiding the cover tape Ca guided by the roller 57 on an end of an attachment body 59, the attachment body 59 being fixed on the unit frame 21 and rotatable around a support axis 58, and applies tension to the cover tape Ca being pushed by a spring 61. A numeral 63 designates a stopper for limiting rotation of the attachment body 59 there.

When the cover tape Ca is peeled off, the drive motor 42 is driven to rotate the first rotating body 46 through the gears 41 and 43. By the rotation of the first rotating body 46, the second rotating body 50 rotates through the gears 45 and 47. By rotation of the second rotating body 50, the third rotating body 56 rotates with the cover tape Ca being interposed between the contact portions 52 and 51 pushed by the spring 55. Then, the cover tape Ca is peeled from the storage tape C by a pitch at the slit of the suppressor 23 without generating the slack, and is stored in a storage portion 26 provided in an end of the component feeding unit 6.

The suppressor 23 forms an almost L shape in its cross-section by a vertical piece as a support portion and a horizontal piece pressing the storage tape C of which the feed holes Cb are engaged with the gear teeth of the sprocket 36 for preventing disengagement of the tape C. The vertical piece is supported by the unit frame 21, being rotatable around the support axis as a fulcrum in its rear end portion inside the unit frame 21, and the horizontal piece has a vertical hook piece in its front end portion, the vertical hook piece having hook holes which can be hooked on a hook body (not shown) applied with pressure by a spring in a hooking direction.

The component feeding unit 6 is so formed that the storage tape C can be set on the component feeding unit 6 through the opening for setting 65 connected to a tape route 64 formed from the side of the component feeding unit 6 to the unit frame 21 with the suppressor 23 rotated upward, which serves as a peeling point of the cover tape Ca of the storage tape C. A numeral 66 designates a prevention member for preventing the storage tape C set in the component feeding unit 6 from separating from the opening for setting 65, which is provided to the tape route 64 near its rear end portion, in an intermediate portion of its horizontal portion, near an upper end portion of its slope portion, in a boundary portion between the horizontal portion and the slope portion, and so on (see FIG. 2).

A numeral 68 designates a label attached to a rear side of a handle 77 of the component feeding unit 6, where a barcode indicating a serial number of the component feeding unit 6 is written. Thus, even when the plurality of component feeding units 6 is set aligned close to each other on the electronic component mounting apparatus body 1, the barcodes can be read out by a barcode scanner (not shown).

Figure 4:
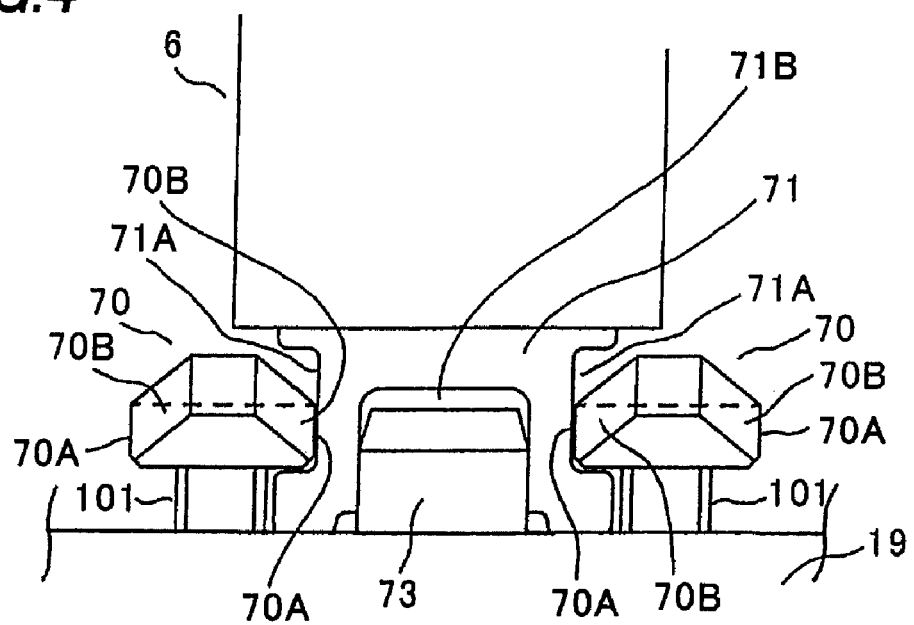
FIG. 4 is a view from an arrow X in FIG. 2, showing a relation of the component feeding unit and the feeder base.
Figure 5:
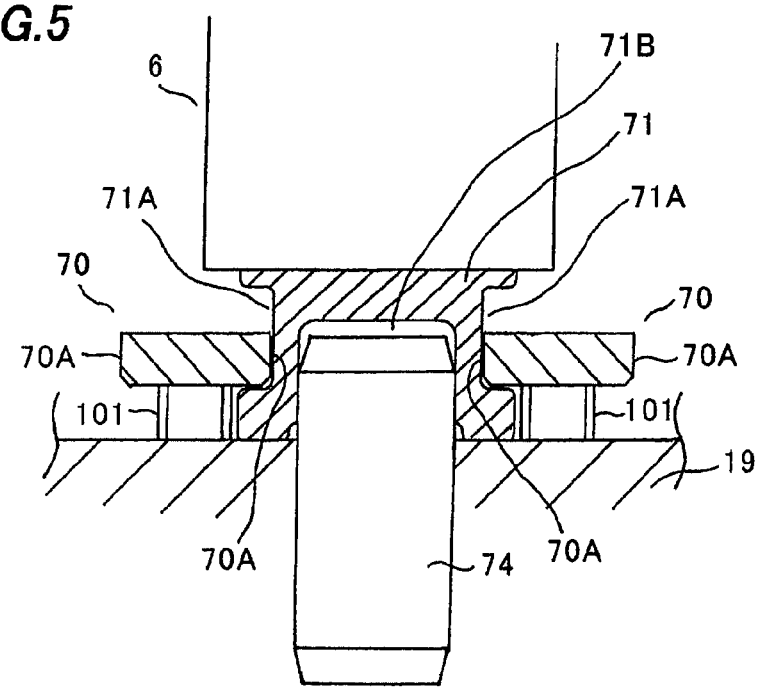
FIG. 5 is a cross-sectional view of FIG. 2 in a position of a front left-to-right control pin, showing the relation of the component feeding unit and the feeder base.

The structure of the component feeding units 6 which are detachably set aligned on the feeder base 19 will be described. First, a pair of guiding members 70 guiding each of the component feeding units 6 and having parallel sides 70A is provided on an upper surface of the feeder base 19 by a plurality of attachment pins 101, and a guided member 71 having a U-shape in its cross-section is provided on a bottom side of the component feeding unit 6, having concave portions 71A on its outer sides where the pair of the guiding members 70 are fit to guide the guided member 71, as shown in FIGS. 1, 4, and 5. The front end portions of the pair of guiding members 70 slopes upward, and are formed with sides 70B facing but increasing in these interval toward the front side.

Although the pair of guiding members 70 is provided for the component feeding unit 6, these guiding members 70 are also used as the guiding members 70 for the adjacent component feeding units 6 since the plurality of component feeding units 6 is set aligned.

A front-to-rear control member 72 is provided, which controls the position of the component feeding unit 6 in a front-to-rear direction by making the guided member 71 reach the end portion of the feeder base 19 in its depth side when the guided member 71 is moved for mounting the component feeding unit 6, being guided by the pair of guiding members 70 and sliding on the feeder base 19.

A cylindrical rear left-to-right control pin 73 is provided on the feeder base 19 between the sides 70A of the guiding members 70 in its front portion, being engaged with a control groove 71B of the guided member 71 to control the position of the component feeding unit 6 in the left-to-right direction. Furthermore, a cylindrical front left-to-right control pin 74 is provided in a position near the front-to-rear control member 72 where the guiding member 70 is not provided, being engaged with the control groove 71B of the guided member 71 to control the position of the unit 6 in the left-to-right direction.

Since the control groove 71B of the guided member 71 is to control the position of the component feeding unit 6 in the left-to-right direction by being engaged with the front left-and-right control pin 74 having a larger diameter than that of the rear left-to-right control pin 73, the control groove 71B is formed to have almost the same width as the diameter of the front left-to-right control pin 74 in the position where the front left-to-right control pin 74 is engaged and to have almost the same width as the diameter of the rear left-to-right control pin 73 in the position where the rear left-to-right control pin 73 is engaged, in order to control the position of the unit 6 in the left-to-right direction when the component feeding unit 6 is fixed to the feeder base 19.

The handle 77 and a lock release lever 79 which is rotatable around a support axis 78 as a fulcrum are formed in the rear portion of the component feeding unit 6. A lock release member 81 having a contact portion 81A and supported rotatably around a support axis 80 as a fulcrum and the lock release lever 79 are connected to each other through a connection plate 84 which is rotatably supported by support axes 82 and 83. Although the lock release member 81 is pulled by a spring 85 so as to rotate in a counterclockwise direction, the rotation in the counterclockwise direction is controlled by a control pin 86.

A coil spring 90 is stretched between an attachment member 87 of the feeder base 19 and a hook member 89 which is rotatable around a support axis 88 as a fulcrum, and applies pressure to the hook member 89 so as to rotate the member 89 in the clockwise direction, the hook member 89 having a first hook member 89A which can be hooked on the first lock member 92 provided on the component feeding unit 6. The first lock member 92 includes a roller 92A and a support member 92B provided with the roller 92A. The lock release lever 79, the lock release member 81, the connection plate 84, and so on form a release device releasing hooking of the first hook member 89A of the hook member 89 from the roller 92A of the first lock member 92.

When the component feeding unit 6 is to be mounted on the feeder base 19, an operator holds the handle 77 and moves the component feeding unit 6 in the depth direction with the guided member 71 guided by the guiding member 70, and the roller 92A is hooked on the first hook member 89A after the roller 92A is in contact with the guide portion 89C of the hook member 89 provided on the electronic component mounting apparatus body 1 and the hook member 89 is being rotated in the counterclockwise direction.

A numeral 93 designates a lock cylinder forming an activating member provided on the electronic component mounting apparatus body 1, and one end portion of a second lock member 95 which is rotatable around a support axis 94 as a fulcrum is in contact with a rod 93A of the lock cylinder 93, being applied with pressure by a spring 96. When the lock cylinder 93 is activated and its rod 93A extends, the second lock member 95 provided on the electronic component mounting apparatus body 1 is rotated in the counterclockwise direction, and a lock lever 95A on another end of the second lock member 95 becomes in contact with a second hook member 89B of the hook member 89, thereby limiting the rotation of the hook member 89 in the counterclockwise direction.

Although the hook member 89 is provided for each of the component feeding units 6, the lock cylinder 93 and the second lock member 95 are provided for the plurality of the component feeding units 6. Therefore, the lock lever 95A is extended in the alignment direction of the component feeding units 6.

Figure 6:
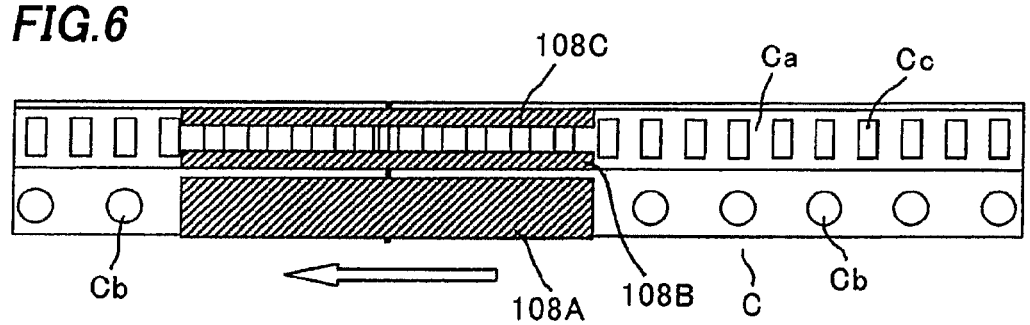
FIG. 6 is a plan view of storage tapes connected to each other with a connection tape.
Figure 7:
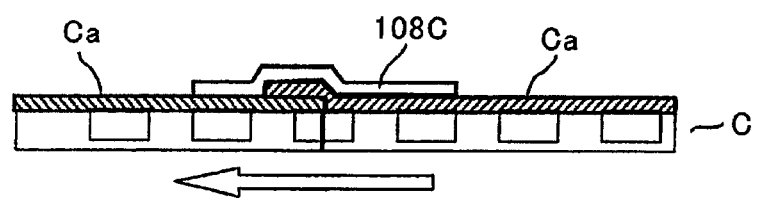
FIG. 7 is a side view of the storage tapes connected to each other with the connection tape.

In FIGS. 6 and 7, a connection tape 108A as well as connection tapes 108B and 108C are for connecting a storage tape C in use which is mounted in the component feeding unit 6 and has the small number of remaining electronic components and a new storage tape C.

Figure 8:
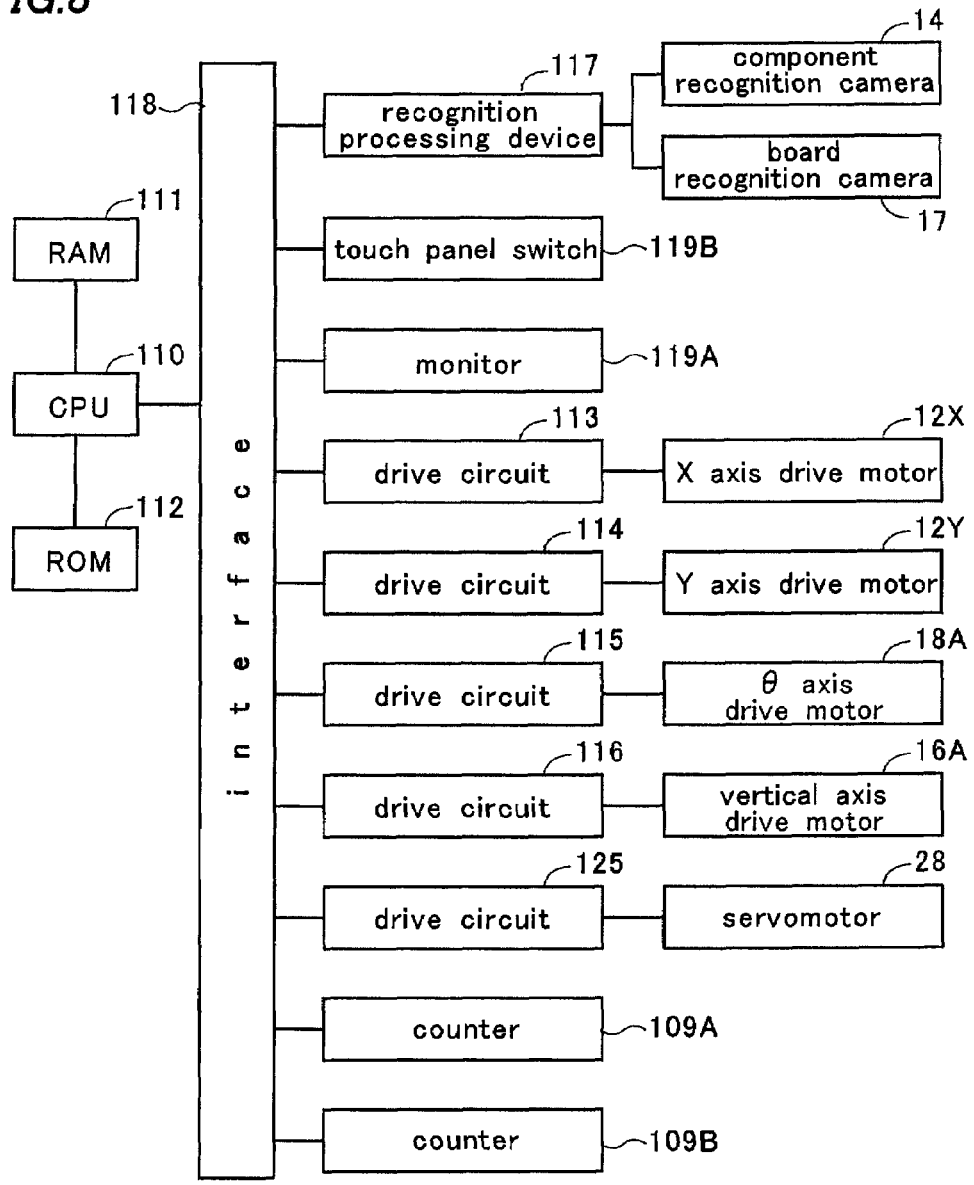
FIG. 8 is a control block diagram.

Next, a control block diagram of the electronic component mounting apparatus of this embodiment shown in FIG. 8 will be described. A numeral 110 designates a CPU (central processing unit) as a control portion for controlling the operation of mounting the electronic component of the electronic component mounting apparatus, a numeral 111 designates a RAM (random access memory) as a memory device, and a numeral 112 designates a ROM (read only memory).

The RAM 111 is stored with mounting data for each of types of the printed board P, which include values in the X and Y directions and an angle on the printed board, alignment numbers of the component feeding units 6, and so on in order of component mounting (in order of step number). The RAM 111 is also stored with component disposition data which include types of the electronic components (component ID) corresponding to the alignment numbers (lane numbers) of the component feeding units 6. The RAM 111 is further stored with component library data including items indicating features of the electronic component in each of ID.

Then, the CPU 110 controls a component mounting operation of the electronic component mounting apparatus based on data stored in the RAM 111 and according to a program stored in the ROM 112. That is, the CPU 110 controls driving of the X axis drive motor 12X, the Y axis drive motor 12Y, the θ axis motor 18A rotating the suction nozzle 18 by θ, and the vertical axis motor 16A vertically moving the mounting head 16 respectively through the drive circuit 113, the drive circuit 114, the drive circuit 115, and the drive circuit 116.

A numeral 117 designates a recognition processing device connected with the CPU 110 through an interface 118. The recognition processing device 117 performs recognition processing to images taken and stored by the component recognition camera 14 or the board recognition camera 17, and sends a recognition result to the CPU 110. That is, the CPU 110 outputs a command to perform recognition processing (e.g. calculation of a shifting amount of an electronic component from a proper position) to images taken and stored by the component recognition camera 14 or the board recognition camera 17 to the recognition processing device 117, and receives a recognition processing result from the recognition processing device 117.

That is, when the recognition processing device 117 performs recognition processing and recognizes a shifting amount from a proper position, this recognition result is sent to the CPU 110. Then, the CPU 110 controls the apparatus body 1 to move the X axis drive motor 12X and the Y axis drive motor 12Y of the XY stage 12, and the θ axis motor 18A of the suction nozzle 18 by a corrected amount and mount the electronic component on the printed board P.

Various touch panel switches 119B as input means for data setting are provided on a monitor 119A as a display device, and an operator can make various settings by operating the touch panel switches 119B. Set data is stored in the RAM 111.

Numerals 109A and 109B designate counters provided for each of the component feeding units 6, and count the number of times the storage tape C is fed (the number of times the CPU 110 sends a feeding command) during the passage of the seamed portion with the connection tapes 108A, 108B and 108C over the component pickup position. The counter 109A resets every N times. It is notes that the expression "the storage tape is fed" means that the storage tape is advanced to the component pick up position."

With the above structure, the operation of mounting the electronic component on the printed board will be described. First, the printed board P is supplied from the feeding conveyer 9 to the set table 8, and positioned and fixed on the set table 8. According to the mounting data stored in the RAM 111, the XY stage 12 is driven to move the head unit 13 to the component feeding unit 6, and the suction nozzle 18 provided on the mounting head 16 is lowered to pick up a required electronic component.

In this case, according to the mounting data, the CPU 110 sends a feeding command to the component feeding unit 6 supplying an electronic component of the first step number of the mounting order, and the CPU 110 drives the servomotor 28 and the drive motor 42 of the component feeding unit 6 to perform the component feeding operation and the peeling operation of the cover tape Ca, the storage tape C is fed under the suppressor 23 to the position where the electronic component is to be picked up, and the electronic component is picked up by suction nozzle 18 through the pickup opening of the suppressor 23.

The mounting head 16 is then moved upward, the XY stage 12 is driven to move the electronic component to the position right above the component recognition camera 14, and the posture and positional shifting of the electronic component on the suction nozzle 18 are recognized. Then, the mounting head 16 is moved to the position of the board P on the set table 8, the board recognition camera 17 recognizes the position of the board P, the X axis drive motor 12X and the Y axis motor 12Y of the XY stage 12 and the θ axis drive motor 18A of the suction nozzle 18 are moved by a corrected amount based on the recognition result of the component recognition camera 14 and the board recognition camera 17 to mount the electronic component on the printed board P.

Next, based on the flow chart of FIG. 9, a description will be given on a seam judgment, i.e., whether or not the seamed portion with the connection tapes 108A, 108B and 108C is passing the component pickup position. As shown in FIG. 6, electronic components are stored in the storage portions Cc of the storage tape C. For example, when the storage portions are recesses formed in the storage tape C as shown in FIG. 7, the edge of the recess defines the storage portion. Even when the connection tapes 108B and 108C are provided over the storage portions Cc as shown in FIGS. 6 and 7, it is possible to feed electronic components from those storage portions Cc. However, it is not uncommon that irregularities in the positional alignment of the storage portions Cc occur because of the application of the connection tapes 108B and 108C. The features explained below are directed to accommodating such irregularities.

As described above, before the electronic component is mounted, the electronic component is picked up from the component feeding unit 6, the component recognition camera 14 takes an image of the electronic component held by suction right above the component recognition camera 14, and the recognition processing device 117 performs recognition processing.

Then, when the CPU 110 judges that the positional shifting amount of the electronic component on the suction nozzle 18 calculated based on the recognition processing result is lower than α, the normal component mounting operation as described above is performed. However, when the positional shifting amount is judged to be α or more, the board recognition camera 17 takes an image of the storage portion Cc of the storage tape C which stores a next electronic component to be picked up by the suction nozzle 18 and which reaches the component pickup position, and the recognition processing device 117 performs recognition processing. When the CPU 110 judges that the positional shifting amount of the storage portion Cc calculated based on the recognition processing result is lower than β, the normal component mounting operation as described above is performed. However, when the positional shifting amount is judged to be β or more, the CPU 110 enables seam passage processing. That is, the CPU 110 judges that the splicing seamed portion is passing the pickup position.

Figure 10:
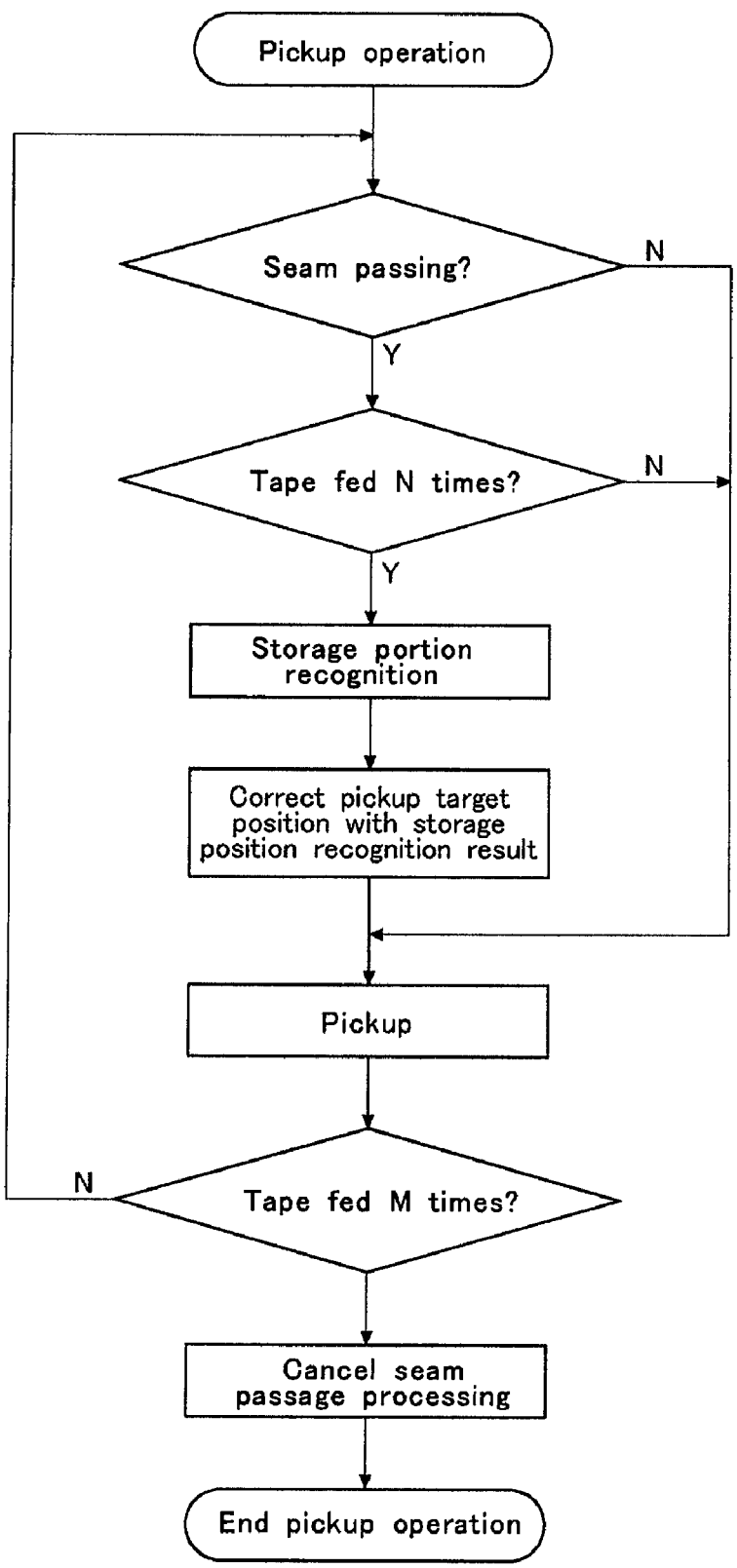
FIG. 10 is a flowchart of a pickup operation at a splicing seamed portion.

Then, as shown in the flow chart of FIG. 10, when the CPU 110 enables the seam passage processing, the CPU 110 judges that the seamed portion is passing the pickup position, and the counter 109A counts the number of times the storage tape C is fed to the component pick up position, i.e., the storage portion Cc storing the next electronic component to be picked up comes to the component pickup position. Then, the board recognition camera 17 takes an image of the storage portion Cc reaching the component pickup position every five times the storage tape C is fed (advanced) to the component pick up position and the recognition processing device 117 performs recognition processing after each image taking. Of course, the frequency of the image taking and recognition processing is not limited to this number "5." The number could be any number as long as it is smaller or equal to the number of the storage portions Cs covered by the connection tapes 108B and 108C. In the explanation below, this number is referred to as "N".

Then, based on this recognition processing result, the CPU 110 moves the X axis drive motor 12X and the Y axis motor 12Y of the XY stage 12 and the θ axis drive motor 18A of the suction nozzle 18 by a corrected amount so as to correct the pickup position where the component is to be picked up by suction, and the next electronic component is picked up from the storage portion Cc of the storage tape C.

Therefore, even when the positional shifting of the storage portion Cc occurs due to the splicing operation connecting the storage tape C in use and the new storage tape C, this is automatically detected, the pickup position is corrected, and the electronic component is picked up from the storage tape C. This prevents the reduction of the pickup rate caused by a component pickup error.

Although the image taking and the recognition processing are performed to the storage portion Cc which reaches the component pickup position each time the storage tape C is fed N times and the pickup position is corrected, the pickup position may be corrected by performing the image taking and the recognition processing when the storage tape C is fed for the first time as well as every N times. It means that the pickup position may be corrected based on the positional shifting amount obtained by the recognition processing of the storage portion Cc at the time when the seam is judged to be passing.

While the above described control is then performed each time the storage tape C is fed N times, the CPU 110 cancels the seam passage processing when the counter 109B counts M, for example, 20 as the feeding times from the time when the CPU 110 enables the seam passage processing. It means that the CPU 110 judges that the seamed portion finishes passing the pickup position and performs the normal pickup operation.

When the CPU 110 enables the seam passage processing, that is, until the M times, the feeding operation of the electronic component is performed as follows. The CPU 110 sends a feeding command to the component feeding unit 6 and drives the servomotor 28 and the drive motor 42 of the component feeding unit 6 to perform the component feeding operation and the peeling operation of the cover tape Ca. At this time, the CPU 110 controls the drive circuit 125 to slow down the servomotor 28. Therefore, the tape feeding speed at the seamed portion with this connection tape 108A is slowed down and the electronic component is prevented from jumping, thereby achieving the stabilization of the pickup operation.

Although the so-called multifunctional chip mounter is used as an example of the electronic component mounting apparatus in the above description, the invention is not limited to this and can be also applied to a high speed type chip mounter such as a rotary table type. The component feeding unit can be mounted on a cart detachably connected to the body, and the feeder base can be provided on a cart.

Figure 9:
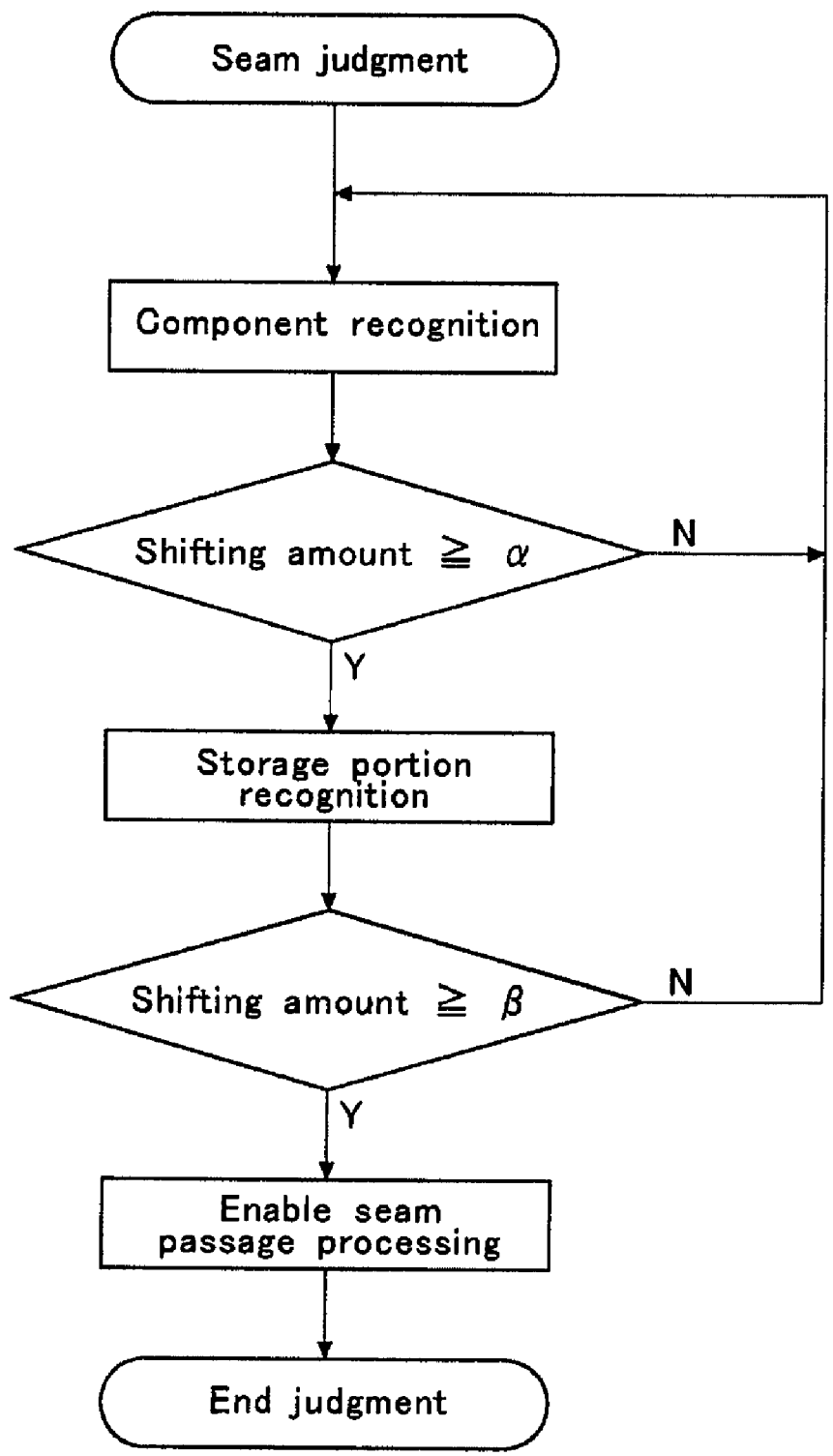
FIG. 9 is a flowchart of seam judgment.

Furthermore, although the flow chart of FIG. 9 is for judging a splicing seam, the invention is also applicable to a case where the positional shifting of the storage portion occurs by other causes than this splicing, and realizes the necessary correction of the pickup position by performing the recognition processing to the storage portion of the storage tape when the shifting amount of the recognized component is large.

Although a particular preferred embodiment of the invention has been disclosed in detail, it will be recognized that variations or modifications of the disclosed apparatus are possible based on the disclosure for those skilled in the art and lie within the scope of the present invention.

Thus, it is possible to reduce a pickup rate when a storage tape in use and a new storage tape are connected to each other with a connection tape due to the reduced number of remaining electronic components.

What is claimed is:

1. An electronic component mounting apparatus, comprising:
   a component feeding unit having a storage tape comprising storage portions in which electronic components are stored and feeding the electronic components to a component pickup position;
   a suction nozzle picking up one of the electronic components from a corresponding storage portion advanced to the component pickup position by the component feeding unit and mounting the electronic component on a printed board;
   a component recognition camera taking an image of the electronic component picked up by the suction nozzle;
   a storage portion recognition camera taking an image of one of the storage portions; and
   control device is configured to calculate a first positional shifting amount base on the image taken by the component recognition camera of the electronic component, to instruct the storage portion recognition camera to take an image of a storage portion storing another electronic component to be picked up when the first positional shifting amount of the electronic component preceding said another electronic component is more than a first predetermined value and to instruct the storage portion recognition camera not to take an image of a storage portion storing another electronic component to be picked up when the first positional shifting amount is smaller than or equal to the first predetermined value, wherein the first predetermined value is a shifting amount from a proper position of the electronic component to be properly mounted onto the printed board.

2. The electronic component mounting apparatus of claim 1, wherein the storage portion recognition camera takes the image of the storage portion of the another electronic component when the storage portion reaches the component pickup position.

3. The electronic component mounting apparatus of claim 1, wherein the control device corrects the component pickup position when a second positional shifting amount calculated based on the image taken by the storage portion recognition camera of the another electronic component is more than a second predetermined value.

4. The electronic component mounting apparatus of claim 3, further comprising a first counter that starts counting the number of times the storage tape is advanced for electronic component feeding when the second positional shifting amount is more than the second predetermined value, wherein the control device corrects the component pickup position every predetermined times the storage tape is advanced for electronic component feeding based on the counting of the first counter.

5. The electronic component mounting apparatus of claim 4, further comprising a second counter that starts counting the number of times the storage tape is advanced for electronic component feeding when the second positional shifting amount is more than the second predetermined value, wherein the control device stops correcting the component pickup position when the number of times the storage tape is advanced for electronic component feeding reaches another predetermined times which are larger than said predetermined times.

* * * * *